(12) United States Patent
Su

(10) Patent No.: US 8,878,370 B2
(45) Date of Patent: Nov. 4, 2014

(54) BOND PAD STRUCTURE

(75) Inventor: Qing Su, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 238 days.

(21) Appl. No.: 13/611,441

(22) Filed: Sep. 12, 2012

(65) Prior Publication Data

US 2013/0075931 A1   Mar. 28, 2013

(30) Foreign Application Priority Data

Sep. 22, 2011   (CN) .......................... 2011 1 0283538

(51) Int. Cl.
*H01L 23/29* (2006.01)
*H01L 23/00* (2006.01)

(52) U.S. Cl.
CPC ....... *H01L 24/05* (2013.01); *H01L 2224/05552* (2013.01); *H01L 2224/05094* (2013.01); *H01L 2224/05095* (2013.01)
USPC ...................................................... 257/779

(58) Field of Classification Search
CPC ........... H01L 2924/01079; H01L 2924/01029; H01L 2924/01013; H01L 2924/01078; H01L 2924/14
USPC .......... 257/779, 778, 784, 786, 774, 780–781
See application file for complete search history.

(56) References Cited

U.S. PATENT DOCUMENTS

2009/0065246 A1*   3/2009   Shih .............................. 174/264

* cited by examiner

*Primary Examiner* — Hoa B Trinh
(74) *Attorney, Agent, or Firm* — MKG, LLC

(57) ABSTRACT

A bond pad structure for an integrated circuit chip package is disclosed. The bond pad structure includes a top metal layer, a patterned metal layer and an interconnection structure. The patterned metal layer is formed below the top metal layer and includes an annular metal layer and a plurality of metal blocks evenly arranged at a central area of the annular metal layer; the patterned metal layer is connected to the top metal layer through both the annular metal layer and the metal blocks. The interconnection structure is formed below the patterned metal layer and is connected to patterned metal layer only through the annular metal layer. By using the above structure, active or passive devices can be disposed under the bond pad structure and will not be damaged by package stress. An integrated circuit employing the above bond pad structure is also disclosed.

20 Claims, 4 Drawing Sheets

BOND PAD STRUCTURE

CROSS-REFERENCES TO RELATED APPLICATION

This application claims the priority of Chinese patent application number 201110283538.4, filed on Sep. 22, 2011, the entire contents of which are incorporated herein by reference.

TECHNICAL FIELD

The present invention relates to a protective structure in an integrated circuit package, and more particularly, to a bond pad structure used in a package of an integrated circuit chip.

BACKGROUND

FIG. 1 shows an existing bond pad structure commonly used in a package of an integrated circuit chip. The bond pad structure is formed of a plurality of metal layers 120, 140, 160 which are stacked and interconnected by vias 130, 150. A passivation layer 180 is formed on the top metal layer 160 and is etched to expose a bond pad window 170. Such a bond pad structure is widely used because of its employment of a great number of layers of metal and its convenience in connecting the layers. However, due to package stress and potential damaging forces, devices are not allowed to be disposed under this bond pad structure, namely the space between the bottom of the bond pad structure and the silicon substrate 100 must be designed as a device-prohibited region 110. For this reason, an area must be specially provided for the bond pad structure on a chip, which is disadvantageous for the reduction of chip areas.

SUMMARY OF THE INVENTION

An objective of the present invention is to provide a bond pad structure for an integrated circuit chip package to solve the problem encountered in the prior art that active or passive devices are not allowed to be disposed under the bond pad structure.

To achieve the above objective, the present invention provides a bond pad structure, which includes a top metal layer; a patterned metal layer formed below the top metal layer, the patterned metal layer comprising an annular metal layer and a plurality of metal blocks evenly arranged at a central area of the annular metal layer, the patterned metal layer being connected to the top metal layer through both the annular metal layer and the metal blocks; and an interconnection structure formed below the patterned metal layer, the interconnection structure being connected to the patterned metal layer only through the annular metal layer.

Further, the interconnection structure may include one layer of metal or a plurality of metal layers interconnected by vias.

According to a preferred embodiment, the top metal layer is octagon-shaped and the annular metal layer is octagon-shaped.

According to a preferred embodiment, the metal blocks are square-shaped.

According to a preferred embodiment, the plurality of metal blocks are arranged into a rectangular matrix.

According to a preferred embodiment, the width of the annular metal layer is 10~20 μm, and the side length of each metal block is 2~5 μm.

According to a preferred embodiment, each of the metal blocks is connected to the top metal layer through 4~8 vias.

According to a preferred embodiment, a bond pad window is provided at a central area of the top metal layer, and the bond pad window has a shape of octagon.

To achieve the above objective, the present invention also provides an integrated circuit, which includes: a silicon substrate; active or negative devices formed on a surface of the silicon substrate; and a bond pad structure formed substantially over at least one of the active or negative devices, wherein the bond pad structure includes: an interconnection structure electrically connected to the at least one of the active or negative devices; a patterned metal layer formed above the interconnection structure, the patterned metal layer comprising an annular metal layer and a plurality of metal blocks evenly arranged at a central area of the annular metal layer, the patterned metal layer being connected to the interconnection structure only through the annular metal layer; and a top metal layer formed above the patterned metal layer and being connected to the patterned metal layer through both the annular metal layer and the metal blocks.

In the bond pad structure of the present invention, the patterned metal layer includes metal blocks and an annular metal layer surrounding the metal blocks; the annular metal layer enables the connection to the peripheral areas of the upper and lower metal layers through vias, while the metal blocks are only allowed to connect to the top metal layer through vias, namely no vias are disposed between the metal blocks and the metal layer therebelow. Therefore, the metal blocks are capable of reducing package stress; even if some of the metal blocks are damaged, the stress will not be passed to the devices under the bond pad structure through the lower metal layers and the vias, thereby making it possible to dispose active or passive devices under the bond pad structure and ensuring that the devices will not be damaged by stress during the packaging process.

By using such a bond pad structure, there is no need to specially provide an area for the bond pad structure on a chip, and therefore the chip areas can be reduced and the design cost can be lowered.

BRIEF DESCRIPTION OF THE DRAWINGS

The present invention will be described and specified below with reference to accompanying drawings and exemplary embodiments.

DETAILED DESCRIPTION

The bond pad structure for an integrated circuit chip package of the present invention includes at least three parallelly arranged metal layers, among which, a second metal layer is disposed below a top metal layer; a third metal layer is disposed below the second metal layer; and so on. The metal layers are interconnected by using vias. For convenience of description, the third metal layer and the metal layers and vias below it are collectively called an "interconnection structure" hereinafter.

Figure 1:
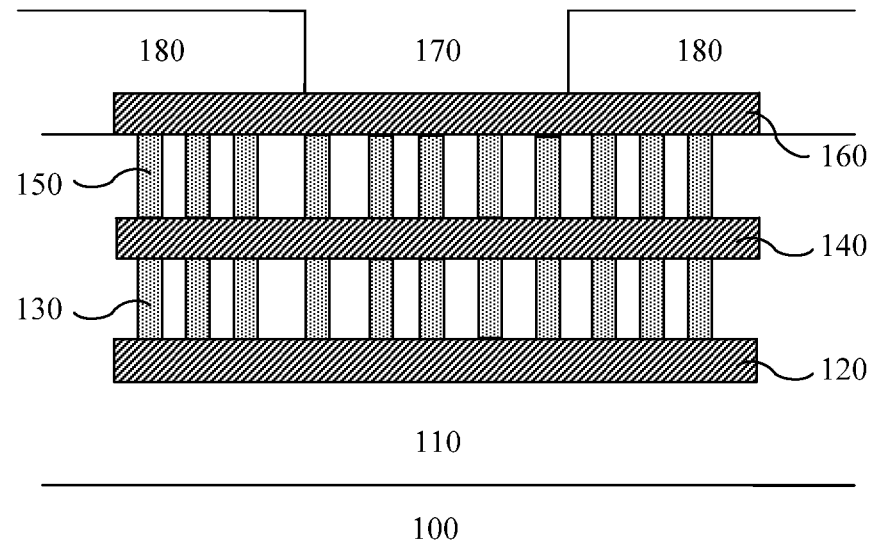
FIG. 1 is a cross-sectional view of an existing bond pad structure used in an integrated circuit chip package.
Figure 2:
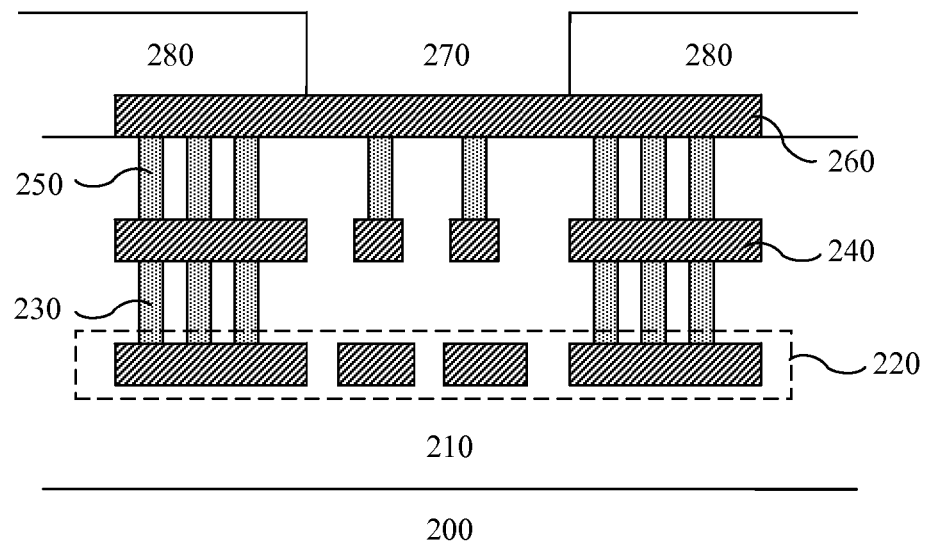
FIG. 2 is a cross-sectional view of the bond pad structure according to a preferred embodiment of the present invention.

As shown in FIG. 2, the bond pad structure according to a preferred embodiment of the present invention includes a top metal layer 260, a second metal layer 240 disposed below the top metal layer 260, and an interconnection structure 220 disposed below the second metal layer 240. In this embodiment, the interconnection structure 220 includes one layer of metal, namely the third metal layer. The metal layers are parallel with one another.

Figure 3:
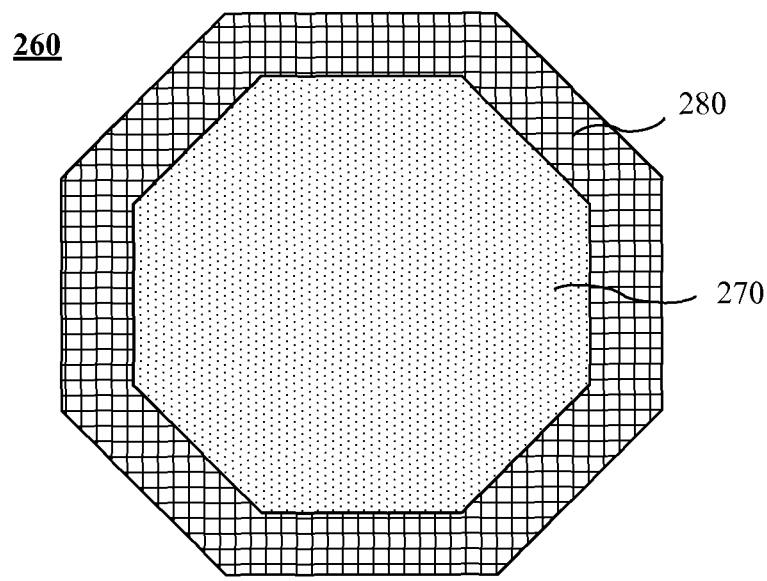
FIG. 3 is a top view of the top metal layer of the bond pad structure as shown in FIG. 2.

Referring to FIG. 3, the top metal layer 260 has a shape of octagon. A bond pad window 270 is provided at the central area of the top metal layer 260. The bond pad window 270 also has a shape of octagon. The surface of the top metal layer 260 excluding the region of the bond pad window 270 is covered by a passivation layer 280 which is formed of silicon oxide. The bond pad window 270 is exposed to the air.

Figure 4:
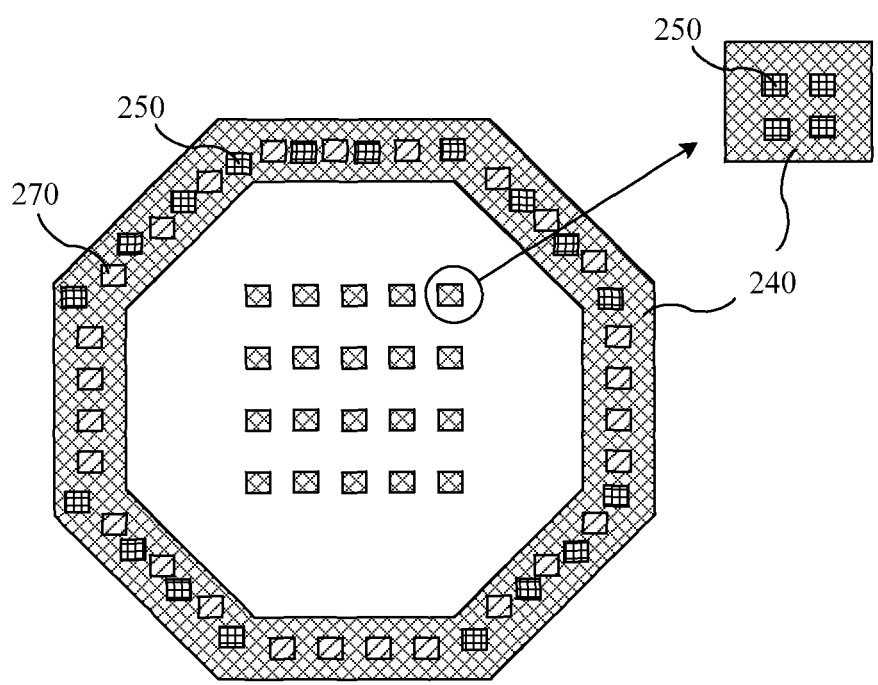
FIG. 4 is a top view of the patterned metal layer and the vias connected thereto of the bond pad structure as shown in FIG. 2.

Referring to FIG. 2 and FIG. 4, the second metal layer 240 includes an annular metal layer and a plurality of metal blocks. In this embodiment, the annular metal layer is octagon-shaped and the plurality of metal blocks are square-shaped. The metal blocks are evenly arranged at the central area of the annular metal layer. In this embodiment, the metal blocks are evenly arranged into a rectangular matrix. It shall be appreciated that the number of metal blocks and their arrangement as shown in the figure are just for the purpose of illustration and shall not be regarded as limitations to the present invention. Preferably, the width of the annular metal layer is from 10 μm to 20 μm and the side length of each of the square-shaped metal blocks is from 2 μm to 5 μm.

Both the annular metal layer and the metal blocks are connected to the top metal layer 260 through a plurality of top vias 250. Each of the metal blocks can be connected to the top metal layer 260 through four to eight top vias (four top vias are shown in FIG. 4).

Referring to FIG. 2 again, the third metal layer is connected to the annular metal layer of the second metal layer 240 through a plurality of second vias 230, or in other words, the second vias 230 are connected to the interconnection structure 220 only through the annular metal layer but not through the metal blocks of the second metal layer 240.

In the second metal layer 240, the annular metal layer enables the connection to the peripheral areas of the upper and lower metal layers through the vias 250 and 230, while the metal blocks are only connected to the top metal layer 260 through the top vias 250, and no vias are provided between the metal blocks and the interconnection structure 220, so that the metal blocks are capable of reducing package stress; even if some of the metal blocks are damaged, the stress will not be passed to the lower metal layers. Therefore, a device region 210 can be provided between the bottom of the bond pad structure and the silicon substrate 200 to accommodate active or passive devices in this region 210 according to the chip design. The interconnection structure 220 can be correspondingly designed and used for normal circuit connection, so that the devices can be electrically led out by the bond pad structure and can be protected by the bond pad structure against the package stress.

Figure 5:
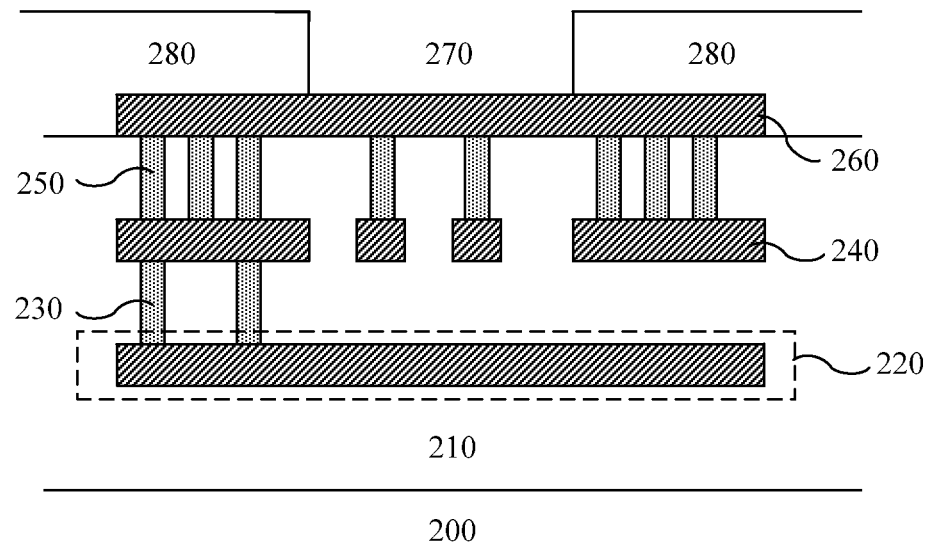
FIGS. 5-7 are cross-sectional views of the bond pad structures according to other embodiments of the present invention.
Figure 6:
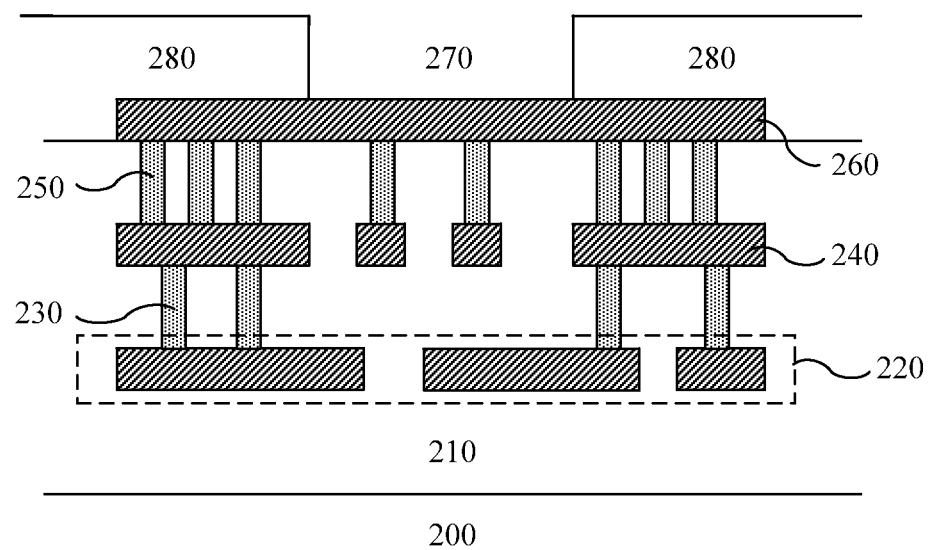
Figure 7:
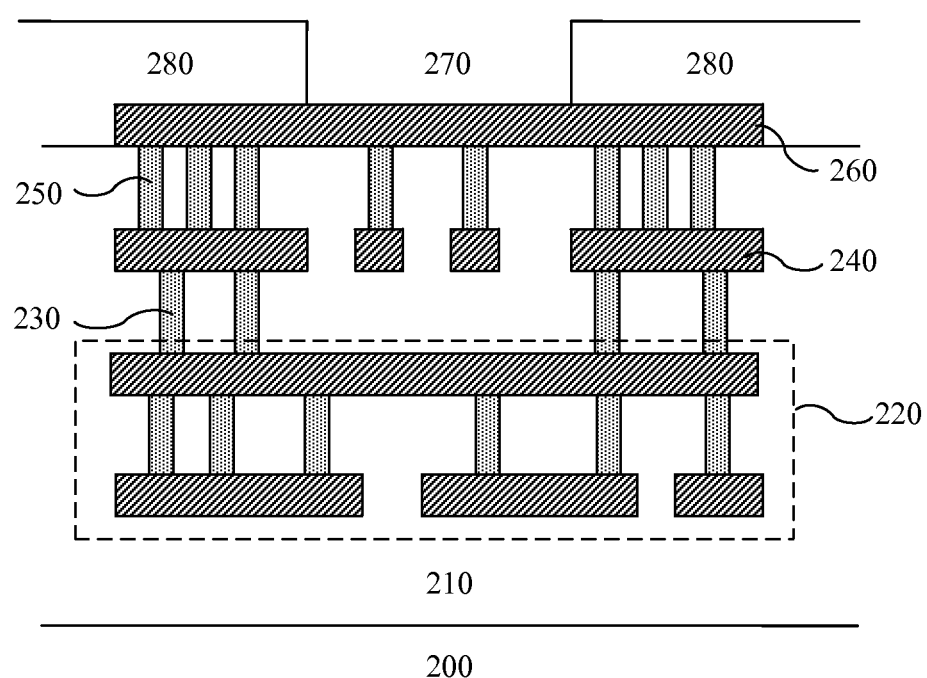

Referring to FIGS. 5-7, according to embodiments of the present invention, the interconnection structure 220 may include one or more metal layers; the patterns of the metal layers may vary according to the circuit design and shall not be limited. Besides, the number and locations of the vias used to connect the metal layers shall not be limited, as long as the top of the interconnection structure 220 is only connected to the annular metal layer of the second metal layer 240 through the second vias 230.

An integrated circuit employing the above bond pad structure is also disclosed. As shown in FIG. 2, the integrated circuit includes: a silicon substrate 200; active or negative devices formed in a region 210 on the surface of the silicon substrate 200; and a bond pad structure formed substantially over the region 210. The bond pad structure may adopt any structure as described in the above embodiments of the present invention and will not be repeatedly described herein.

Above described are nothing but several ways to carry out embodiments of the present invention. Those skilled in the art can make various variations and modifications to the embodiments without departing from the spirit or scope of the present invention. Thus, it shall be appreciated that the scope of the present invention shall not be limited to the embodiments and it is intended that the scope of the present invention is solely defined by the appended claims.

What is claimed is:

1. A bond pad structure, comprising:
   a top metal layer;
   a patterned metal layer formed below the top metal layer, the patterned metal layer comprising an annular metal layer and a plurality of metal blocks evenly arranged at a central area of the annular metal layer, the patterned metal layer being connected to the top metal layer through both the annular metal layer and the metal blocks; and
   an interconnection structure formed below the patterned metal layer, the interconnection structure being connected to the patterned metal layer only through the annular metal layer.

2. The bond pad structure according to claim 1, wherein the interconnection structure comprises one layer of metal or a plurality of metal layers interconnected by vias.

3. The bond pad structure according to claim 1, wherein the top metal layer is octagon-shaped and the annular metal layer is octagon-shaped.

4. The bond pad structure according to claim 1, wherein the metal blocks are square-shaped.

5. The bond pad structure according to claim 1, wherein the plurality of metal blocks are arranged into a rectangular matrix.

6. The bond pad structure according to claim 1, wherein the width of the annular metal layer is 10~20 μm.

7. The bond pad structure according to claim 6, wherein the side length of each metal block is 2~5 μm.

8. The bond pad structure according to claim 1, wherein each of the metal blocks is connected to the top metal layer through 4~8 vias.

9. The bond pad structure according to claim 1, wherein a bond pad window is provided at a central area of the top metal layer.

10. The bond pad structure according to claim 3, wherein a bond pad window is provided at a central area of the top metal layer, the bond pad window having a shape of octagon.

11. An integrated circuit, comprising:
    a silicon substrate;
    active or negative devices formed on a surface of the silicon substrate; and
    a bond pad structure formed substantially over at least one of the active or negative devices,
    wherein the bond pad structure comprises:
       an interconnection structure electrically connected to the at least one of the active or negative devices;

a patterned metal layer formed above the interconnection structure, the patterned metal layer comprising an annular metal layer and a plurality of metal blocks evenly arranged at a central area of the annular metal layer, the patterned metal layer being connected to the interconnection structure only through the annular metal layer; and a top metal layer formed above the patterned metal layer and being connected to the patterned metal layer through both the annular metal layer and the metal blocks.

12. The integrated circuit according to claim 11, wherein the interconnection structure comprises one layer of metal or a plurality of metal layers interconnected by vias.

13. The integrated circuit according to claim 11, wherein the top metal layer is octagon-shaped and the annular metal layer is octagon-shaped.

14. The integrated circuit according to claim 11, wherein the metal blocks are square-shaped.

15. The integrated circuit according to claim 11, wherein the plurality of metal blocks are arranged into a rectangular matrix.

16. The integrated circuit according to claim 11, wherein the width of the annular metal layer is 10~20 μm.

17. The integrated circuit according to claim 16, wherein the side length of each metal block is 2~5 μm.

18. The integrated circuit according to claim 11, wherein each of the metal blocks is connected to the top metal layer through 4~8 vias.

19. The integrated circuit according to claim 11, wherein a bond pad window is provided at a central area of the top metal layer.

20. The integrated circuit according to claim 13, wherein a bond pad window is provided at a central area of the top metal layer, the bond pad window having a shape of octagon.

* * * * *